United States Patent [19]

Sun

[11] Patent Number: 5,789,290

[45] Date of Patent: Aug. 4, 1998

[54] POLYSILICON CMP PROCESS FOR HIGH-DENSITY DRAM CELL STRUCTURES

[75] Inventor: Shih-Wei Sun, Taipei, Taiwan

[73] Assignee: United Microelectronics Corporation, Taiwan

[21] Appl. No.: 806,698

[22] Filed: Feb. 26, 1997

Related U.S. Application Data

[60] Provisional application No. 60/024,491 Aug. 21, 1996.
[51] Int. Cl.⁶ .............................................. H01L 21/8242
[52] U.S. Cl. ........................................... 438/253; 438/633
[58] Field of Search ................................. 438/253, 396, 438/633, 634, 645

[56] References Cited

U.S. PATENT DOCUMENTS

| | | | |
|---|---|---|---|
| 5,084,405 | 1/1992 | Fazan et al. | 438/253 |
| 5,627,094 | 5/1997 | Chan et al. | 438/253 |
| 5,674,783 | 10/1997 | Jang et al. | 438/633 |

*Primary Examiner*—Chandra Chaudhari
*Attorney, Agent, or Firm*—Rabin & Champagne, P.C.

[57] ABSTRACT

Pass transistors are formed on the active device regions of a substrate and a layer of silicon oxide is deposited over the transistors and the surface of the layer of silicon oxide is planarized. A thin layer of silicon nitride is deposited on the oxide layer and then vias are opened through the silicon nitride and silicon oxide layers to expose one of the source/drain regions of each of the pass transistors in the memory array. A layer of polysilicon is deposited so as to extend through the vias, forming polysilicon vertical interconnects in contact with the source/drain regions of the pass transistors and then the layer of polysilicon is patterned to form capacitor bottom plates, with each of the capacitor bottom plates connected to a corresponding source/drain region. A second layer of silicon oxide is deposited to cover the capacitor bottom plates and photolithography is performed to provide a plurality of openings through the second silicon oxide layer to each of the capacitor bottom plates. Polysilicon is deposited to fill each of the openings and chemical mechanical polishing is performed to remove excess polysilicon using the silicon oxide layer as a polish stop. The second oxide layer is stripped to leave the capacitor bottom plates with fins or posts extending vertically from the bottom plates. A capacitor dielectric is then formed over the capacitor bottom electrodes, capacitor upper electrodes are formed, and further processing continues in the conventional manner.

14 Claims, 3 Drawing Sheets

POLYSILICON CMP PROCESS FOR HIGH-DENSITY DRAM CELL STRUCTURES

This application claims priority from provisional application Ser. No. 60/024,491, filed Aug. 21, 1996.

BACKGROUND OF THE INVENTION

1. Field of the Invention

The present invention relates to the formation of capacitor structures over doped regions within semiconductor devices and, more particularly, to the formation of capacitor devices that store charge within dynamic random access memory (DRAM) devices.

2. Description of the Related Art

Further reductions in the size of memory cells within dynamic random access memory (DRAM) devices, and corresponding increases in the storage density of DRAMs, present a variety of challenges related to the reduced dimensions of the structures within the memory cell and in the increased processing difficulty associated with making such small structures. The typical DRAM memory cell consists of a charge storage capacitor electrically connected to the drain of a "pass" MOS transistor. The pass transistor acts as a switch for selectively coupling the charge storage capacitor to the memory cell's signal lines during data read out or write processes to discharge or charge the capacitor. As DRAM memory cells are made smaller, efforts are made to reduce the size of the pass transistor and the capacitor, while maintaining the capacitance of the capacitor to keep constant the amount of charge stored in the memory cell.

A difficulty that arises with making dynamic random access memories (DRAMs) in accordance with smaller design rules is that the charge storage capacitors of the DRAM are made too small to retain an acceptable level of charge. Too small of charge storage capacitors can make the reading of data from the DRAM cell undesirably difficult, can make the data stored within the DRAM cell undesirably vulnerable to noise or leakage, and can require too frequent of data refresh operations. There is, therefore, a continuing need to develop charge storage capacitors for DRAMs which provide a larger level of capacitance but which take up the same or a smaller amount of substrate area. One strategy for making higher capacitance charge storage capacitors is to provide stacked and finned capacitor structures so that additional capacitor surface area is provided by adding vertical superstructure to the capacitor.

Conventional methods of forming stacked and finned capacitor structures, however, are undesirably complex. For example, many such processes require multiple high accuracy alignment steps to form a vertically extending capacitor fin.

SUMMARY OF THE PREFERRED EMBODIMENTS

It is accordingly an object of the present invention to provide a more manufacturable method of forming a DRAM capacitor structure.

One aspect of the invention provides a method of making a memory device on a substrate comprising the steps of providing a transistor having source/drain regions formed on a surface of the substrate, and having a gate electrode formed above the surface of the substrate. A first insulating layer is deposited over the transistor and a second insulating layer of an insulating material different from the first insulating layer is deposited over the first insulating layer. A first opening is provided through the first and second insulating layers to expose a first source/drain region of the transistor and a first layer of polysilicon is deposited over the second insulating layer so that the first layer of polysilicon is in electrical contact with the first source/drain region of the transistor. A third insulating layer is deposited over the first layer of polysilicon and patterned to provide second openings to expose the first layer of polysilicon. A second layer of polysilicon is deposited to fill the second openings and the device is polished to remove excess portions of the second layer of polysilicon. The third insulating layer to expose a polysilicon superstructure extending vertically above the first layer of polysilicon, forming at least a part of a bottom electrode for the charge storage capacitor. A dielectric layer is formed over the polysilicon superstructure and the first layer of polysilicon and a third layer of polysilicon is deposited and formed into an upper electrode for the charge storage capacitor.

Another aspect of the present invention provides a method of making a memory device on a substrate, the memory device including a charge storage capacitor, the method comprising the steps of providing a transistor having source/drain regions formed on a surface of the substrate, and having a gate electrode formed above the surface of the substrate and depositing a first insulating layer over the transistor. A first opening is provided through the first insulating layer to expose a first source/drain region of the transistor and a first layer of conductive material is formed over the first insulating layer so that the first layer of conductive material is electrically coupled to the first source/drain region of the transistor. A second insulating layer is deposited over the first layer of conductive material and patterned to provide second openings which expose the first layer of conductive material. A second layer of conductive material is deposited to fill the second openings and the device is polished to remove excess portions of the second layer of conductive material. The second insulating layer is removed to expose a superstructure extending vertically above the first layer of conductive material, forming at least a part of a bottom electrode for the charge storage capacitor. A dielectric layer is formed over the superstructure and the first layer of conductive material and a third layer of conductive material is deposited and formed into an upper electrode for the charge storage capacitor.

DETAILED DESCRIPTION OF THE PREFERRED EMBODIMENTS

Preferred embodiments of the present invention provide a method of making a DRAM charge storage capacitor that is simpler than conventional manufacturing processes. Particularly preferred embodiments of the present invention form a vertically extending fin or post structure for a stacked capacitor electrode using a chemical mechanical polishing process to avoid use of other more complex and more expensive photolithography processes.

An embodiment of this invention may form field oxide isolation structures on a silicon substrate, thereby defining active device regions on the substrate. Pass transistors are then formed on the active device regions and a layer of silicon oxide is deposited. Preferably, the silicon oxide is formed so as to have a planar surface or the silicon oxide layer is planarized. A thin layer of silicon nitride is deposited on the oxide layer and then vias are opened through the silicon nitride and silicon oxide layers to expose one of the source/drain regions of each of the pass transistors in the memory array. A layer of polysilicon is deposited so as to extend through the vias, forming polysilicon vertical interconnects in contact with the source/drain regions of the pass transistors. Photolithography is performed to laterally define capacitor bottom plates from the layer of polysilicon, with each of the capacitor bottom plates connected to a source/drain region of a pass transistor through a corresponding polysilicon vertical interconnect. A second layer of silicon oxide is deposited to cover the capacitor bottom plates and photolithography is performed to provide a plurality of openings through the second silicon oxide layer to each of the capacitor bottom plates. A second layer of polysilicon is then deposited so as to fill each of the openings. Chemical mechanical polishing is then performed using the silicon oxide layer as a polish stop to remove excess portions of the second layer of polysilicon. The second oxide layer is stripped to leave the capacitor bottom plates with fins or posts extending vertically from the bottom plates. A capacitor dielectric is then formed over the capacitor bottom electrodes, capacitor upper electrodes are formed, and further processing continues in the conventional manner.

Figure 1:
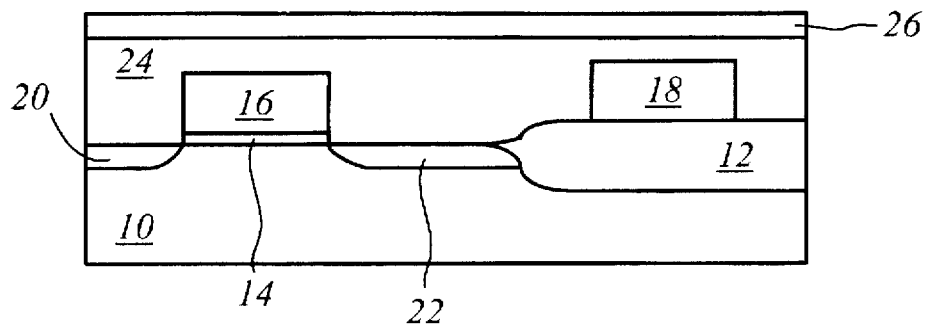
FIGS. 1-7 illustrate a DRAM charge storage capacitor and a method for making a DRAM charge storage capacitor in accordance with preferred embodiments of the present invention.

Aspects of the present invention are now described in greater detail with reference to the figures. FIG. 1 shows in partial cross-section a portion of a DRAM cell at an intermediate stage of processing. A DRAM pass or transfer transistor is formed on the left of the illustrated cell and a charge storage capacitor will be formed in contact with one of the source/drain regions of the cell's pass transistor. A field isolation region 12 of, for example silicon oxide, is formed by a LOCOS or other device isolation process on the surface of a P-type silicon substrate 10. A gate oxide layer 14 is formed over the substrate to a thickness of between about 40–200 Å by a high temperature oxidation process or by CVD. A layer of polysilicon is deposited over the surface of the substrate 10 and on the gate oxide layer 14 by low pressure chemical vapor deposition (LPCVD) at a temperature of approximately 600°–650° C. to a thickness of between about 2000–4000 Å. The layer of polysilicon is doped, preferably N-type, either during deposition or by ion implantation followed by an anneal. If a multi-layer conductor such as a metal silicide/polysilicon layered structure is to be used as the gate electrode of the DRAM transistor, then the multi-layer conductor structure is preferably formed at this time.

The gate electrodes and wiring lines are then patterned by forming a photoresist or other mask and then etching to form a polysilicon gate electrode 16 and a polysilicon wiring line 18. Source/drain contacts 20, 22 are then formed. In some embodiments, a lightly doped portion of a lightly doped drain (LDD) structure is formed in source/drain regions 20, 22 by implanting, for example, arsenic or phosphorus ions to form moderately doped N-type regions in the substrate. Insulating sidewall spacer structures may then be provided alongside the gate electrode 16 and the wiring line 20. The spacers may be formed from silicon oxide or silicon nitride by blanket depositing a layer of an appropriate insulating material over the device and then etching back the insulating layer to form the spacers. A second implantation is then performed to complete the LDD structure of the source/drain regions 20, 22, forming heavily doped regions in the source/drain regions self-aligned to the spacers on either side of the gate electrode 16 of the cell transistor. In other embodiments, particularly those made in accordance with small dimension design rules, an LDD structure may be used for the drain region only, with the source region having a uniform doping or uniform, moderate doping levels might be used in both the source and the drain of the pass transistor.

After the source and drain regions are formed for the pass transistor, a layer 24 of an insulator such as silicon oxide is deposited over the device, for example by a plasma enhanced chemical vapor deposition (PEVCD) process using a tetra-ethyl-ortho-silicate (TEOS). Other insulators and other deposition methods can be used for the insulating layer 24, although it is preferred that any substitution of materials preserve the differential etching properties and etch or polish stop properties discussed below between the layer 24 and the other layers of the device which are exposed when the insulating layer 24 is etched. It is preferred that the insulator 24 have a planar surface, whether the planar surface is obtained through a multi-layer deposition and etch back process or through, for example, a CMP process. In either case, a sufficiently thick oxide layer is desirably left over the surface of both the gate electrode 16 and the wiring line 18. To this end, it is desirable for the silicon oxide layer 24 to be deposited to a thickness of between about 2500–5000 Å. Next, a relatively thin layer 26 of a second insulating material such as silicon nitride is deposited by, for example, a CVD process. Layer 26 will be used as an etch stop layer, so it is preferable that the silicon nitride layer be at least about 300–500 Å. This produces the structure illustrated in FIG. 1. In the illustrated memory cell, as is the case in many conventional DRAMs, one of the source/drain regions (20) serves as a bit line for coupling together several pass transistors, while the other of the source/drain regions 22 will act as a contact for the charge storage capacitor. Gate electrode 16 functions as a word line in this DRAM.

Figure 2:
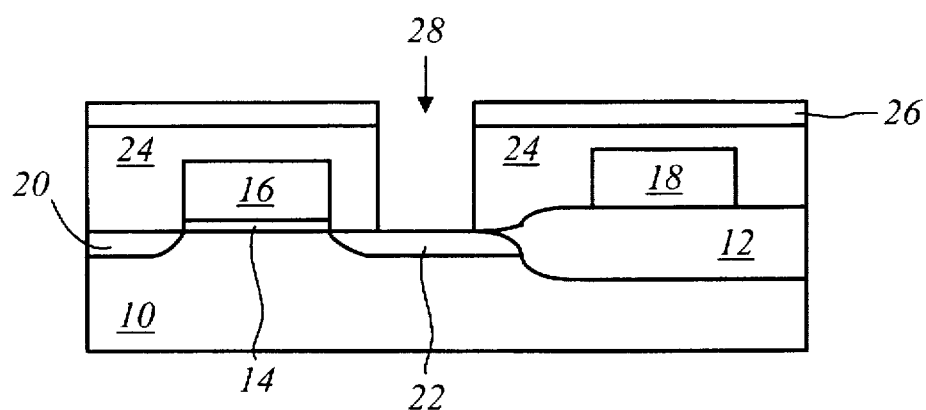

A photoresist layer is provided to the surface of the FIG. 1 device and a mask is formed over the surface of the silicon nitride layer 26 with an opening aligned over the source/drain region 22. Silicon nitride layer 26 is then etched using an anisotropic etching process and a suitable etchant gas mixture such as a mixture of $SF_6$, He and $O_2$. Silicon oxide layer 24 is etched using, for example, a gas mixture consisting of $CHF_3$, $O_2$ and Ar to first expose the surface of the substrate at the source/drain region 22 and then overetching continues to clear the surface to ensure that a subsequent deposition of doped polysilicon makes a good contact with the source/drain region 22. A well-suited etching environment for each of these processes, as well as other anisotropic etching processes used in this method, is the P5000 etcher manufactured by Applied Materials Corporation, although similar etching systems can also be used. After the via 28 has been etched to expose the surface of the source/drain region 22, the photoresist mask is removed by ashing to produce the structure shown in FIG. 2.

Figure 3:
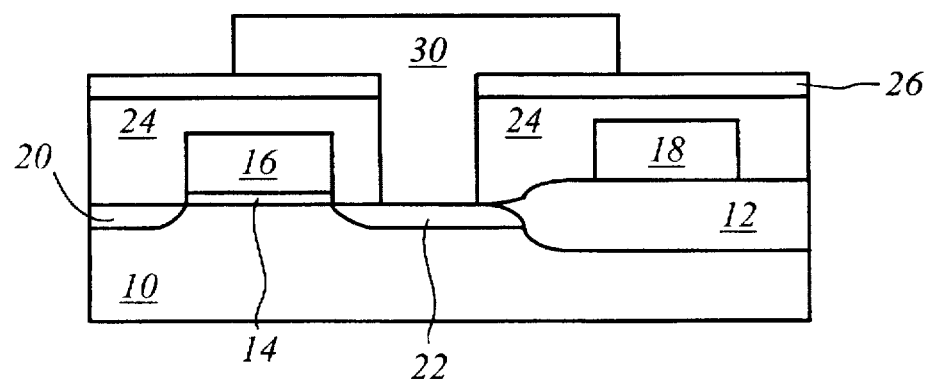

A layer of polysilicon is deposited by LPCVD at a temperature of approximately 600°–650° C. to a thickness of between about 1000–5000 Å over the surface of the silicon nitride layer 26 and extending as a vertical interconnect through the via 28 to contact the source/drain region 22. The layer of polysilicon is doped N-type either during deposition by addition of phosphine or arsine during the deposition or by ion implantation of, for example, phosphorus ions at a preferred energy of between about 30 KeV to 100 KeV, to a dose of about $1\times10^{16}$ ions/$cm^2$, followed by an anneal. A layer of photoresist is deposited and patterned on top of the polysilicon layer to form a mask that is used to laterally define the polysilicon layer into plates 30 which form part of the bottom electrode of the charge storage capacitor. The polysilicon etching process may be performed using a plasma etchant derived from chlorine gas and a bromine-containing gas such as HBr. As shown in FIG. 3, the polysilicon plates 30 which form the base of the bottom electrodes of the charge storage capacitors are connected to one of the source/drain regions of the corresponding pass transistors by polysilicon interconnects that extend vertically through the vias 28 in the silicon oxide layer 24.

A second layer of silicon oxide 32, or some other sacrificial material that preferably can be anisotropically etched without etching either polysilicon or the material used in the second insulating layer 26, is deposited over the plates of the capacitor bottom electrodes and over the exposed portions of the second insulator layer 26. The thickness to which the second layer of silicon oxide 30 is deposited determines the height of the fins, posts or other structures that are formed on the plates 32. Accordingly, it is desirable to make the silicon oxide layer 32 relatively thick, for example, between 2000–10,000 Å.

A mask is then formed over the surface of the silicon oxide layer 32, for example using conventional photolithographic methods, leaving a pattern of openings on the surface of the second layer of silicon oxide 32 and aligned over each of the polysilicon plates 30. As a practical matter, any pattern that can be formed on the surface of the silicon oxide layer 32 can be used for forming the vertically extending portion of the bottom electrode of the capacitor. For example, possible patterns include concentric rings or squares, an array of parallel rectangles, or an array of squares or circles. The silicon oxide layer 32 is then etched using, for example, a gas mixture consisting of $CHF_3$, $O_2$ and Ar to first expose the surface of the substrate at the plate 30 and then overetching to clear the surface of the plate 30 to ensure that a subsequent deposition of doped polysilicon makes good contact. The mask is then removed.

Figure 4:
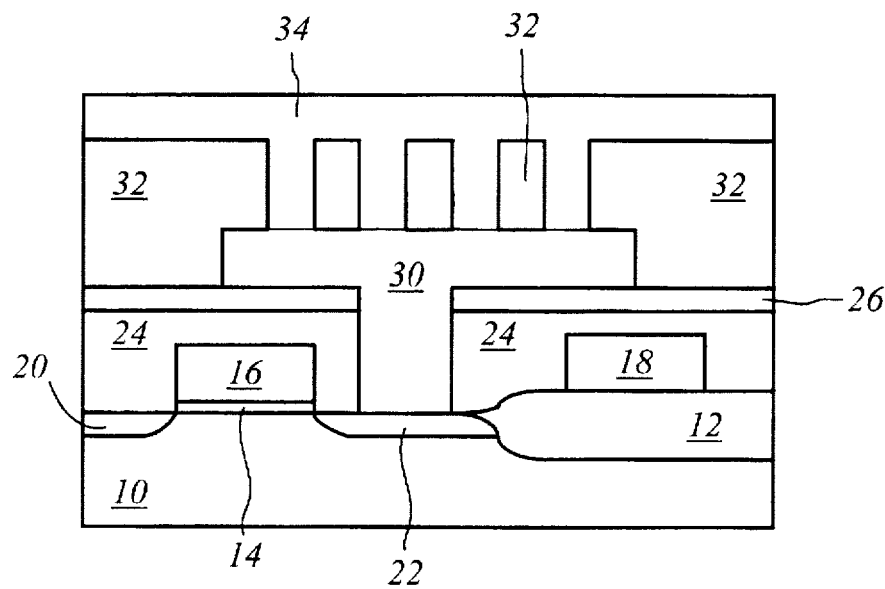
Figure 5:
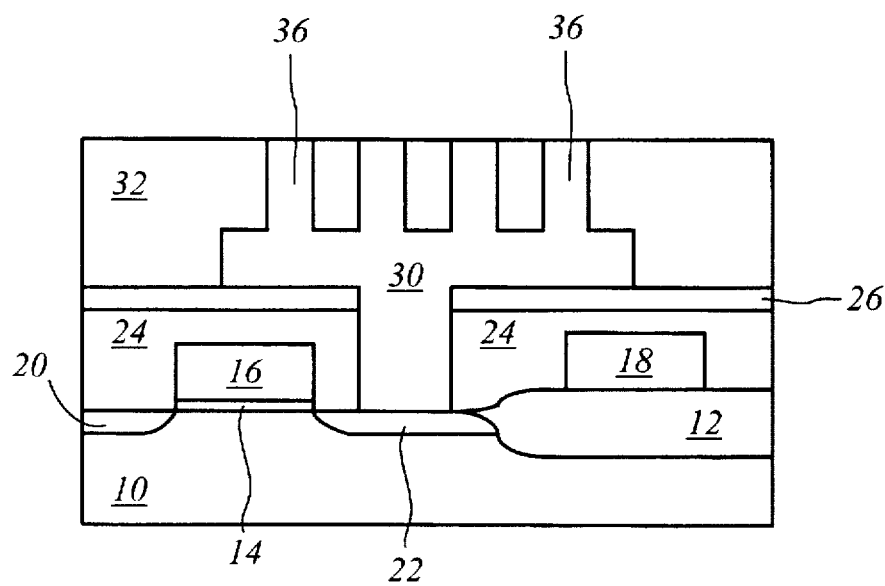
Figure 6:
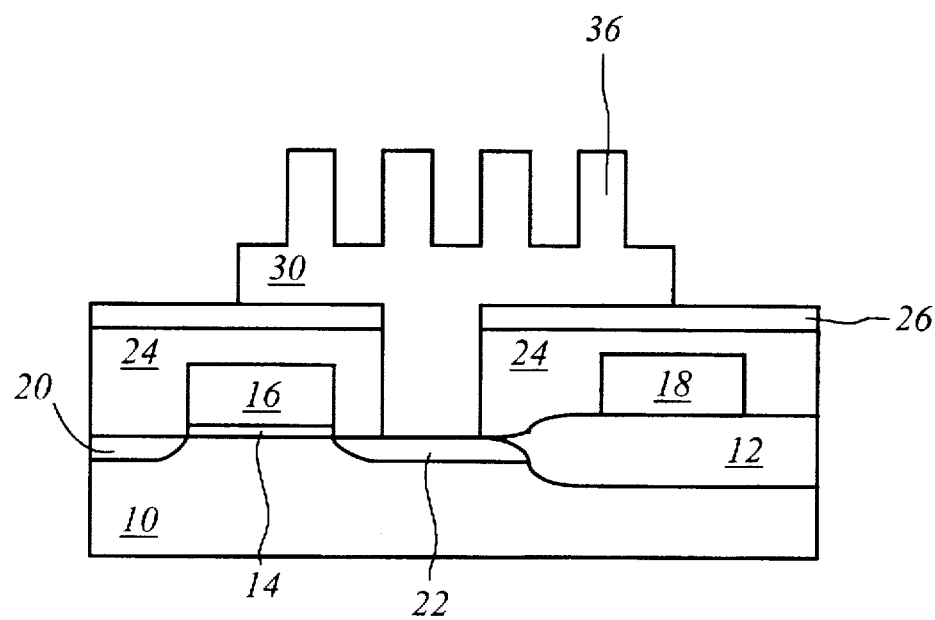

A layer of polysilicon 34 is deposited by LPCVD into the openings formed through the silicon oxide layer 32 to the surface of the plates 30, depositing sufficient polysilicon to overfill the openings, as shown in FIG. 4. This layer of polysilicon 34 can be doped during deposition or by ion implantation in the same manner as was used for doping the polysilicon plate 30. Chemical mechanical polishing is then performed to remove the excess polysilicon. The surface of the silicon oxide layer 32 is used as a polish stop so that the entire vertical extent of the posts, fins or other superstructure 36 formed above the plate 30 remains in place (FIG. 5). The silicon oxide layer 32 is then removed, preferably using a dilute HF solution, because HF effectively etches silicon oxide without unacceptable etching of the silicon nitride etch stop layer 26. This etch leaves the bottom electrode exposed, as shown in FIG. 6, with the polysilicon bottom electrode superstructure 36 extending above the plate 30 by about 2000–10,000 Å.

Figure 7:
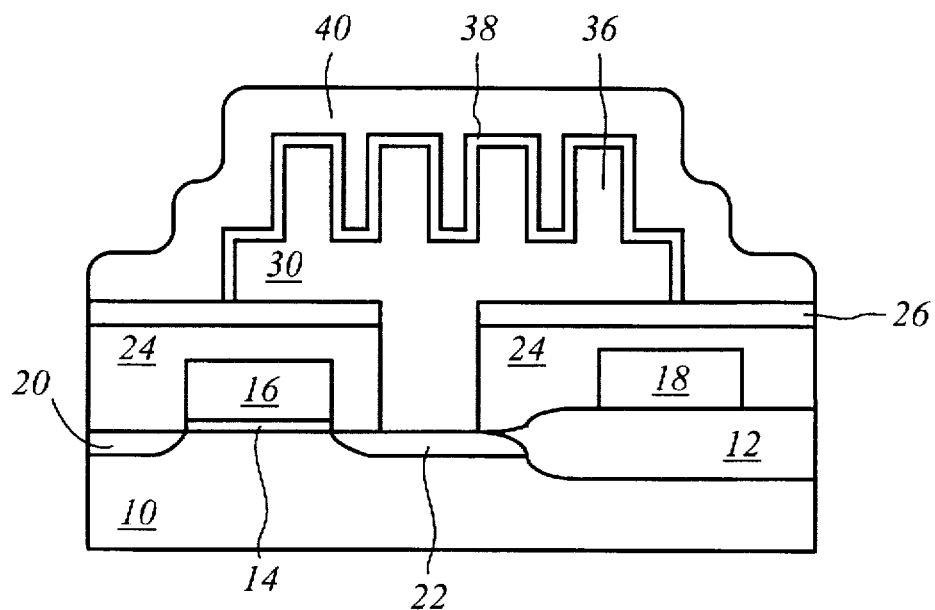

Processing continues by forming a dielectric layer 38 on the exposed polysilicon surfaces of the charge storage capacitor's bottom electrode, shown in FIG. 7, to a thickness of 30–150 Å. Desirably, the dielectric material has a high dielectric constant and can be made thin without pinholes and or other local defects. An appropriate dielectric layer can be formed by depositing a layer of silicon nitride, for example by CVD, and then growing a thin oxide layer on the surface of the silicon nitride layer. Often, this "NO" layer is formed on top of an oxide layer, such as a native oxide layer covering the surface of the polysilicon lower electrode, so that the actual dielectric film formed has an "ONO" structure. Alternatively, the native oxide on the surface of the bottom electrode can be removed by dipping the device in a dilute HF solution. Then the dielectric layer formed has an "NO" structure. Finally, a polysilicon layer 40 is deposited by LPCVD over the device (FIG. 7), and then the polysilicon layer 40 is doped by ion implantation and patterned to form an upper electrode for the capacitor. Further conventional processing is performed to complete the DRAM device.

The present invention has been described in terms of certain preferred embodiments. The invention is not, however, limited to the specific embodiments described, but also includes such modifications and variations as fall within the scope of the following claims.

What is claimed:

1. A method of making a memory device on a substrate, the memory device including a charge storage capacitor, the method comprising the steps of:

providing a transistor having source/drain regions formed on a surface of the substrate, and having a gate electrode formed above the surface of the substrate;

depositing a first insulating layer over the transistor;

depositing over the first insulating layer a second insulating layer of an insulating material different from the first insulating layer;

providing a first opening through the first and second insulating layers to expose a first source/drain region of the transistor;

depositing a first layer of polysilicon over the second insulating layer, the first layer of polysilicon in electrical contact with the first source/drain region of the transistor;

depositing a third insulating layer over the first layer of polysilicon and patterning the third insulating layer to provide second openings and to expose the first layer of polysilicon;

depositing a second layer of polysilicon to fill the second openings;

polishing to remove excess portions of the second layer of polysilicon;

removing the third insulating layer to expose a polysilicon superstructure extending vertically above the first layer of polysilicon, forming at least a part of a bottom electrode for the charge storage capacitor;

forming a dielectric layer over the polysilicon superstructure and the first layer of polysilicon; and depositing a third layer of polysilicon and forming an upper electrode for the charge storage capacitor.

2. The method of claim 1, wherein one of the first and the second insulating layer comprises silicon oxide and another of the first and second insulating layer comprises silicon nitride.

3. The method of claim 2, wherein the first insulating layer is silicon oxide.

4. The method of claim 1, further comprising the step of planarizing the surface of the first insulating layer.

5. The method of claim 1, wherein the first opening is filled by the first layer of polysilicon.

6. The method of claim 1, wherein the third insulating layer is removed using the second insulating layer as an etch stop.

7. The method of claim 5, wherein the third insulating layer is silicon oxide.

8. The method of claim 7, further comprising the step, prior to the step of depositing a third insulating layer, of patterning the first layer of polysilicon to form a plate above the first source/drain region of the transistor.

9. The method of claim 1, wherein the transistor is coupled to a bit line and wherein the memory device is a DRAM.

10. The method of claim 1, wherein the step of polishing is a chemical mechanical polishing process that uses a surface of the third insulating layer as a polish stop.

11. The method of claim 1, wherein the polysilicon superstructure comprises an array of fins or posts.

12. A method of making a memory device on a substrate, the memory device including a charge storage capacitor, the method comprising the steps of:

providing a transistor having source/drain regions formed on a surface of the substrate, and having a gate electrode formed above the surface of the substrate;

depositing a first insulating layer over the transistor;

providing a first opening through the first insulating layer to expose a first source/drain region of the transistor;

forming a first layer of conductive material over the first insulating layer, the first layer of conductive material electrically coupled to the first source/drain region of the transistor;

depositing a second insulating layer over the first layer of conductive material and patterning the second insulating layer to provide second openings which expose the first layer of conductive material;

depositing a second layer of conductive material to fill the second openings;

polishing to remove excess portions of the second layer of conductive material;

removing the second insulating layer to expose a superstructure extending vertically above the first layer of conductive material, forming at least a part of a bottom electrode for the charge storage capacitor;

forming a dielectric layer over the superstructure and the first layer of conductive material, and depositing a third layer of conductive material and forming an upper electrode for the charge storage capacitor.

13. The method of claim 12, wherein the step of polishing is a chemical mechanical polishing process that uses a surface of the second insulating layer as a polish stop.

14. The method of claim 12, wherein the second insulating layer is formed from a material different from the material used to form the first insulating layer.

* * * * *